United States Patent [19]
Chang

[11] Patent Number: 5,705,439
[45] Date of Patent: Jan. 6, 1998

[54] METHOD TO MAKE AN ASYMMETRICAL LDD STRUCTURE FOR DEEP SUB-MICRON MOSFETS

[75] Inventor: Ming-Bing Chang, Santa Clara, Calif.

[73] Assignee: Taiwan Semiconductor Manufacturing Company Ltd., Hsin-Chu, Taiwan

[21] Appl. No.: 635,826

[22] Filed: Apr. 22, 1996

[51] Int. Cl.[6] ................................................ H01L 21/336
[52] U.S. Cl. ............................ 438/286; 438/304; 438/307
[58] Field of Search ..................................... 438/179, 267, 438/286, 303, 304, 305, 307, 596

[56] References Cited

U.S. PATENT DOCUMENTS

| | | | |
|---|---|---|---|
| 4,956,308 | 9/1990 | Griffin et al. | 437/41 |
| 4,997,779 | 3/1991 | Kohno | 437/41 |
| 5,001,077 | 3/1991 | Sakai | 438/179 |
| 5,032,535 | 7/1991 | Kamijo et al. | 438/307 |
| 5,063,172 | 11/1991 | Manley | 438/596 |
| 5,286,664 | 2/1994 | Horiuchi | 437/44 |
| 5,344,788 | 9/1994 | Noda | 438/179 |
| 5,364,807 | 11/1994 | Hwang | 438/286 |
| 5,413,969 | 5/1995 | Huang | 438/286 |
| 5,429,960 | 7/1995 | Hong | 437/35 |
| 5,547,888 | 8/1996 | Yamazaki | 438/286 |
| 5,578,509 | 11/1996 | Fujita | 438/286 |
| 5,604,139 | 2/1997 | Codama et al. | 438/286 |
| 5,661,048 | 8/1997 | Davies et al. | 438/286 |

FOREIGN PATENT DOCUMENTS 3-42842  2/1991  Japan.

*Primary Examiner*—Charles L. Bowers, Jr.
*Assistant Examiner*—Leon Radomsky
*Attorney, Agent, or Firm*—George O. Saile; Stephen B. Ackerman; Rosemary L. S. Pike

[57] ABSTRACT

A method for forming an asymmetrical LDD structure is described. A polysilicon gate electrode is formed overlying a layer of gate silicon oxide on the surface of a semiconductor substrate. The surfaces of the semiconductor substrate and the gate electrode are oxidized to form a surface oxide layer. Polysilicon spacers are formed on the sidewalls of the gate electrode wherein one side of the gate electrode is a source side and the other side of the gate electrode is a drain side. The polysilicon spacer on the source side of the gate electrode is removed. First ions are implanted to form heavily doped source and drain regions within the semiconductor substrate not covered by the gate electrode and the polysilicon spacer on the drain side of the gate electrode. Then the drain side polysilicon spacer is removed. Second ions are implanted to form a lightly doped drain region within the semiconductor substrate underlying the removed drain side polysilicon spacer completing the formation of a lightly doped drain structure in the fabrication of an integrated circuit device.

10 Claims, 4 Drawing Sheets

METHOD TO MAKE AN ASYMMETRICAL LDD STRUCTURE FOR DEEP SUB-MICRON MOSFETS

BACKGROUND OF THE INVENTION

(1) Field of the Invention

The invention relates to the fabrication of integrated circuit devices, and more particularly, to a method of improved LDD structure having minimal source resistance in the fabrication of integrated circuits.

(2) Description of the Prior Art

A typical LDD (lightly doped source and drain) structure is formed by an LDD mask implant followed by spacer oxide deposition and etching and then a source/drain mask implant. Typical symmetrical LDD structures suffer from high source resistance which can cause up to a 10% $Id_{sat}$ performance degradation. Asymmetrical LDD structures made with a dielectric spacer cannot meet the current 0.35 design rules because of an excessive field oxide loss which occurs during the multiple spacer oxide etching steps.

U.S. Pat. No. 5,286,664 to Horiuchi teaches selectively forming only a drain side silicon oxide spacer, but using non-standard chemicals. U.S. Pat. No. 5,429,960 to Hong teaches forming an asymmetrical LDD by large implant. U.S. Pat. No. 4,956,308 to Griffin et al discloses the use of a photoresist mask for ion implantation so that the gate is separated from the N+ region on the drain side. U.S. Pat. No. 4,997,779 to Kohno teaches the formation of an asymmetrical LDD by etching away a portion of the gate at the drain side.

SUMMARY OF THE INVENTION

A principal object of the present invention is to provide an effective and very manufacturable method of forming an LDD structure.

A further object of the invention is to provide a method of forming an asymmetrical LDD structure with minimal source resistance.

Yet another object is to provide a method of forming an asymmetrical LDD structure which is compatible with current 0.35 design rules.

Yet another object is to provide a method of forming an asymmetrical LDD structure wherein source/drain junction depth is minimized.

In accordance with the objects of this invention a method for forming an asymmetrical LDD structure is achieved. A polysilicon gate electrode is formed overlying a layer of gate silicon oxide on the surface of a semiconductor substrate. The surfaces of the semiconductor substrate and the gate electrode are oxidized to form a surface oxide layer. Polysilicon spacers are formed on the sidewalls of the gate electrode wherein one side of the gate electrode is a source side and the other side of the gate electrode is a drain side. The polysilicon spacer on the source side of the gate electrode is removed. First ions are implanted to form heavily doped source and drain regions within the semiconductor substrate not covered by the gate electrode and the polysilicon spacer on the drain side of the gate electrode. Then the drain side polysilicon spacer is removed. Second ions are implanted to form a lightly doped drain region within the semiconductor substrate underlying the removed drain side polysilicon spacer completing the formation of a lightly doped drain structure in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
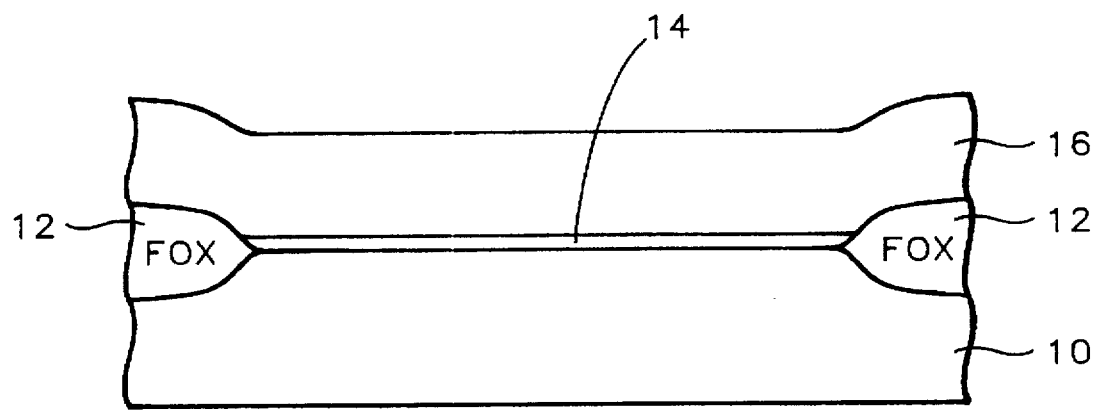
FIGS. 1 through 10 schematically illustrate in cross-sectional representation a preferred embodiment of the present invention.

Referring now more particularly to FIG. 1, there is shown an illustration of the N channel portion of a partially completed, CMOS metal oxide field effect transistor (MOSFET) and capacitor. The semiconductor substrate 10 is preferably composed of silicon having a (100) crystallographic orientation. In an effort to simplify the description and the drawings the dielectric isolation between devices has been only partially shown and will not be described in detail, because they are conventional. For example, Field OXide regions FOX 12 can be formed in and on the semiconductor substrate. Then semiconductor devices can be provided in the silicon mesas according to the following processes.

The surface of the silicon substrate 10 is thermally oxidized to form the desired gate oxide 14 thickness. The preferred thickness is between about 70 to 80 Angstroms for 0.35 µm technology.

Figure 2:
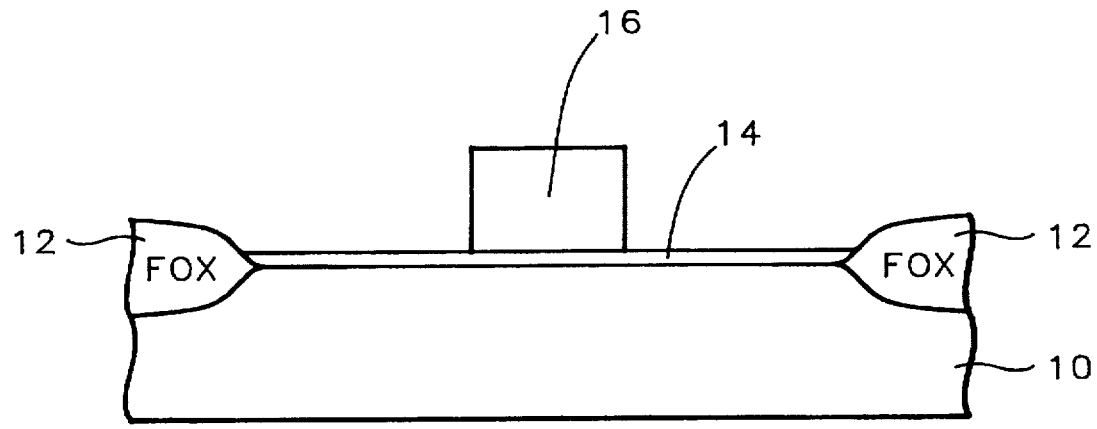

The polysilicon layer 16 is deposited, for example by low pressure chemical vapor deposition (LPCVD), to a thickness of between about 2500 to 3000 Angstroms. The polysilicon layer 16 is etched away where it is not covered by a mask to form polysilicon gate electrode 16, as shown in FIG. 2.

Figure 3:
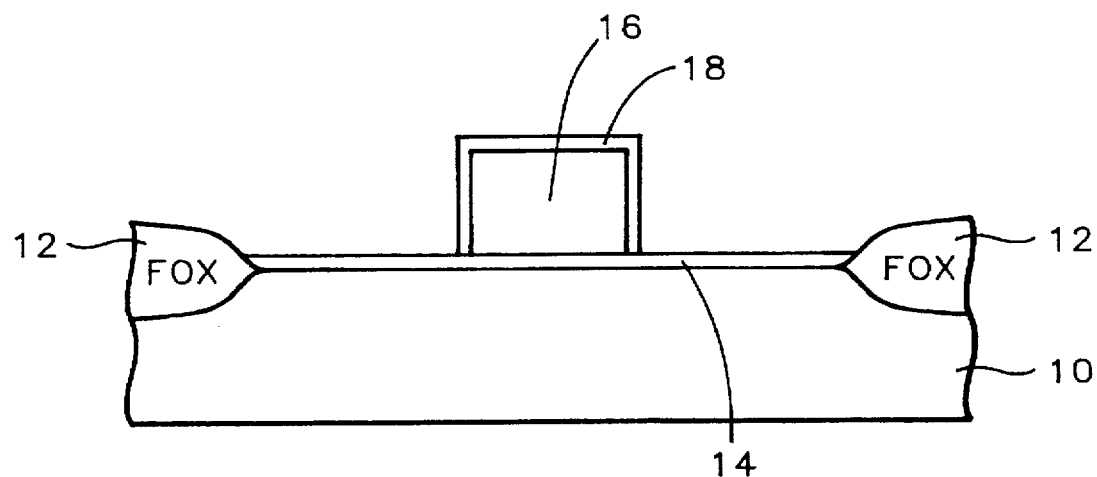

Referring now to FIG. 3, the surfaces of the polysilicon gate electrode are oxidized to form the surface silicon oxide layer 18 having a thickness of about 100 Angstroms. This surface silicon oxide layer 18 acts as an etch stop during the spacer etching and will protect the silicon surface and minimize channeling effects during ion implantation.

Figure 4:
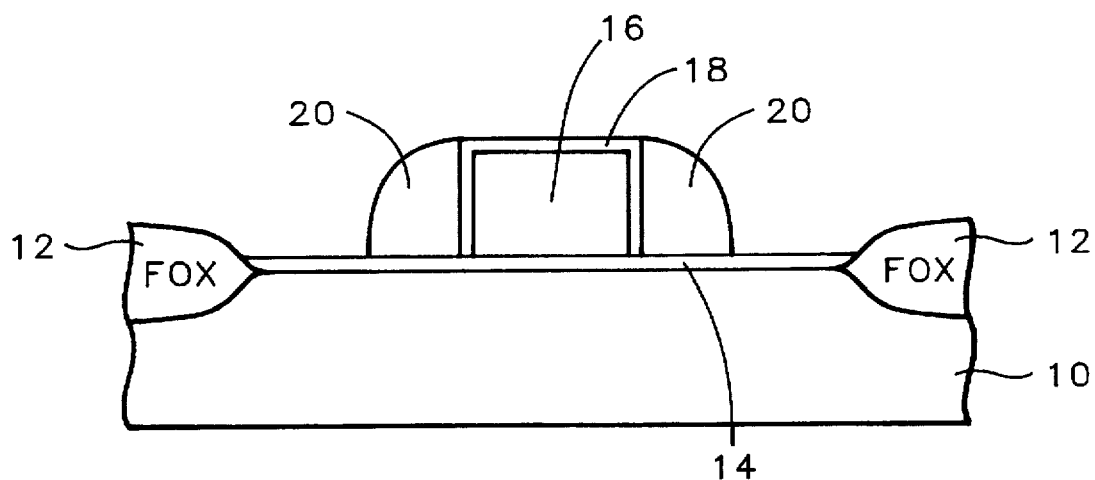

A second layer of polysilicon is deposited and anisotropically etched to form spacers 20 on the sidewalls of the polysilicon gate 16, as illustrated in FIG. 4. The spacers have a width of about 1000 Angstroms for the 0.35 micron technology. There is virtually no field oxide loss during the polysilicon spacer etch because the etch rate selectivity of polysilicon to oxide is more than 50 to 1. This fact allows the use of a thinner field oxide. The conventional field oxide as grown is about 3500 Angstroms for the 0.35 µm technology. With the polysilicon spacer process of the present invention, the as-grown field oxide thickness can be reduced to about 3000 Angstroms.

Figure 5:
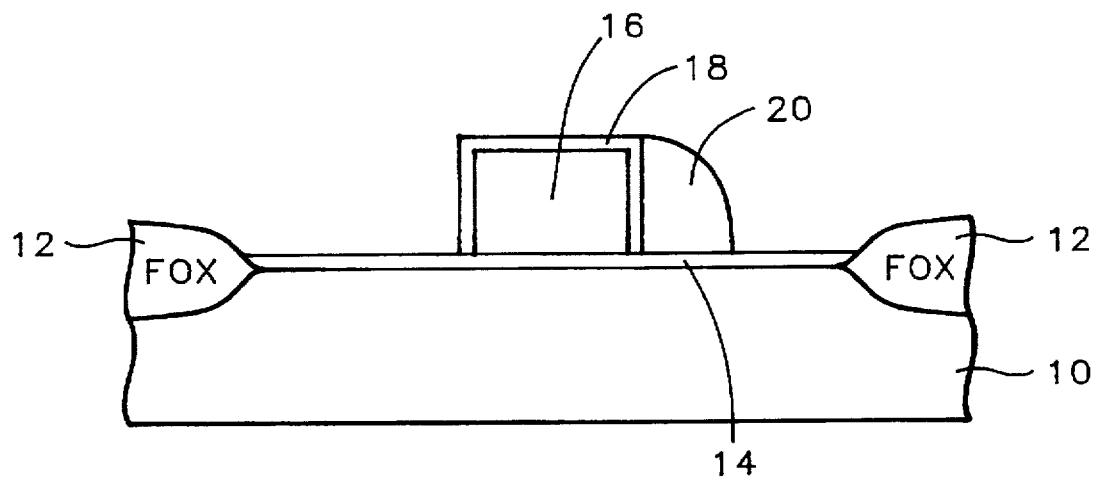

The spacer on the source side is removed by an isotropic polysilicon etch, using an additional mask. The result is illustrated in FIG. 5.

Figure 6:
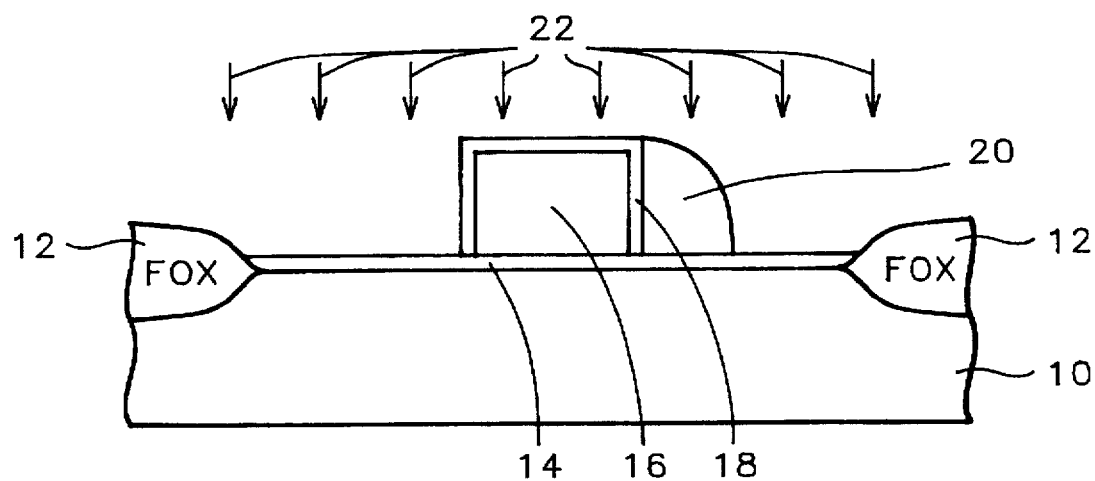
Figure 7:
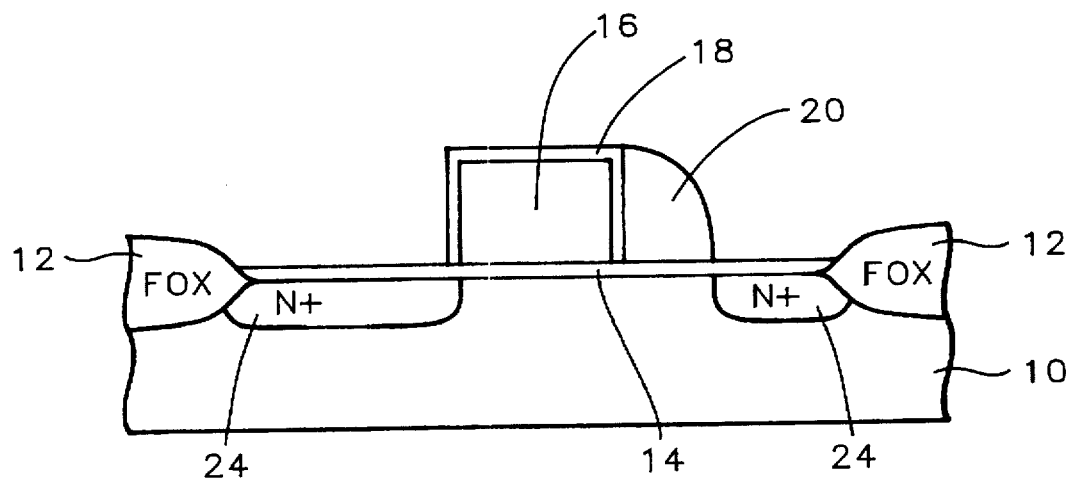

The source/drain structure of the MOS FET may now be formed. Referring now to FIG. 6, the LDD source/drain regions are formed by the ion implantation of arsenic (N+) ions 22 to form the heavily doped regions 24, as shown in FIG. 7. The polysilicon sidewall 20 on the drain side and the gate electrode act as a mask for the ion implantation. The wafer is annealed, for example at a temperature of between about 850° to 900° C. for between about 20 to 30 minutes to activate the N+ ions. Next, a P+ ion implantation is performed for the PMOS portion of the CMOSFET (not shown).

Next, the polysilicon spacer 20 is stripped, for example using an isotropic polysilicon etch, stopping at the oxide 18.

Figure 8:
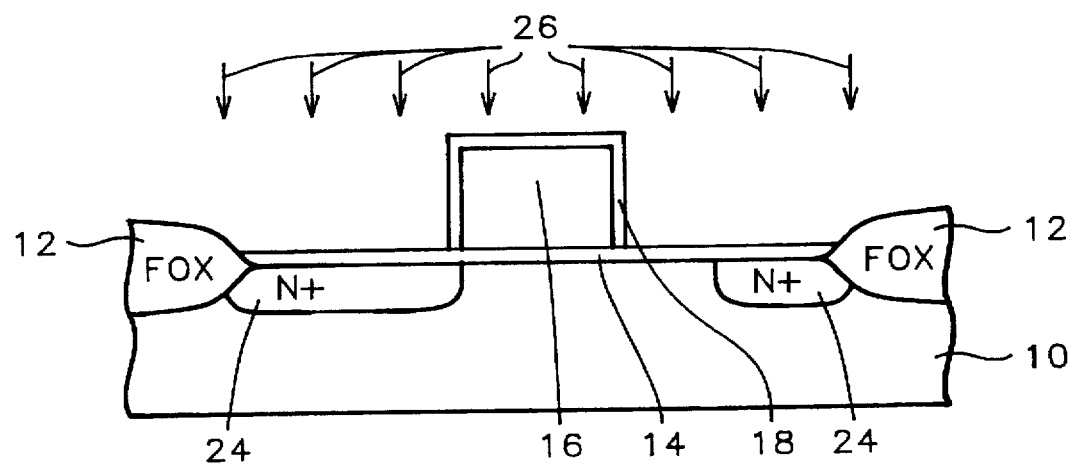
Figure 9:
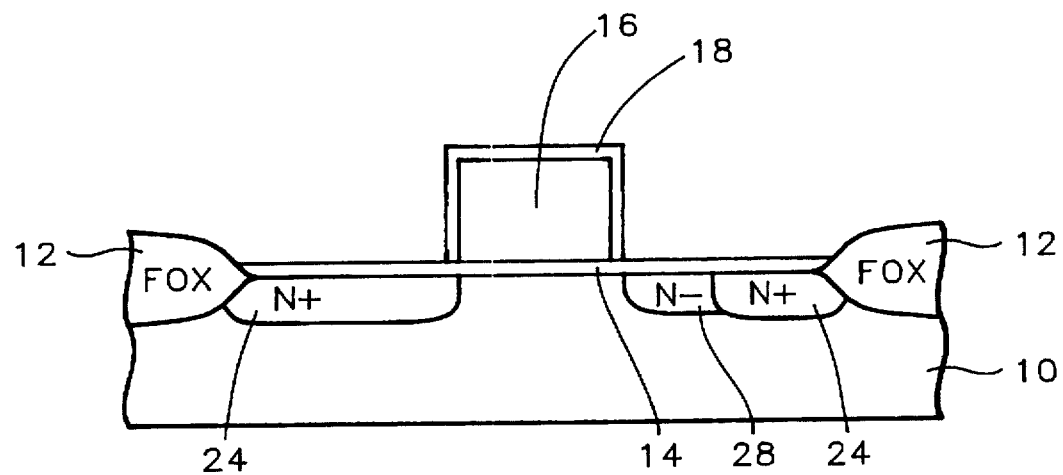

Referring now to FIG. 8, N– phosphorus ions 26 are implanted into the substrate to form the lightly doped drain N– region 28, illustrated in FIG. 9. Optionally, P– ions are implanted to form P– regions in the PMOS portion of the MOSFET (not shown).

Because the N+ and N- implant sequence is reversed, only the slower moving N+ arsenic ions are exposed to the activation annealing. The faster moving N- phosphorus ions are not exposed to the high temperature annealing. Thus, the junction depth is minimized.

Figure 10:
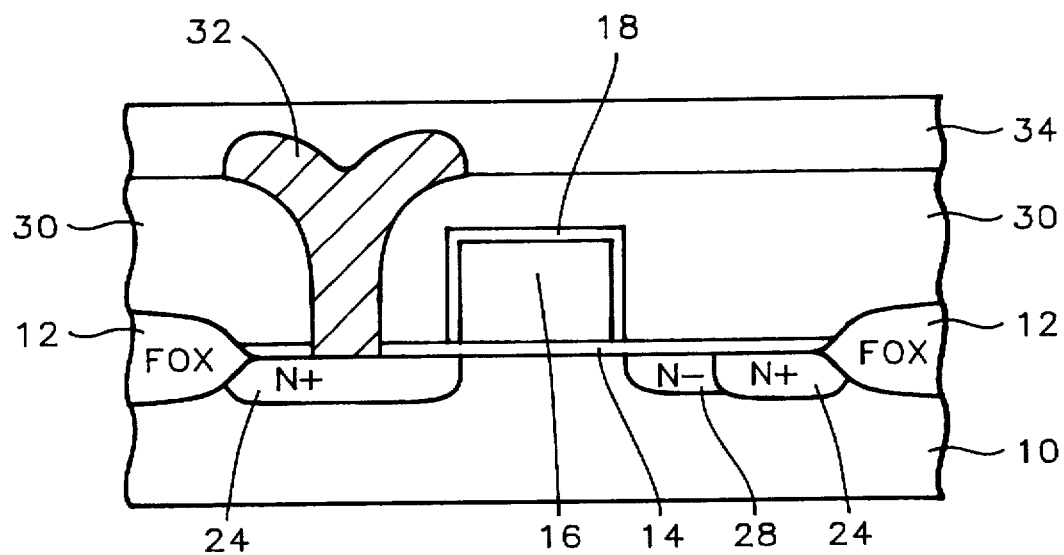

This completes the formation of the LDD structure. The integrated circuit device is completed as is conventional in the art. For example, as illustrated in FIG. 10, insulating layer 30 is deposited over the surface of the substrate. Contact openings are made through the insulating layer to the underlying semiconductor devices, such as to source region 24. A metal layer 32 is deposited and patterned to form electrical connections between the elements of the integrated circuit. A passivation layer 34 completes the fabrication of the integrated circuit.

The process of the invention provides a disposable polysilicon spacer process which minimizes source resistance and is fully compatible with existing 0.35 micron processes with only one additional mask required.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a layer of gate silicon oxide over the surface of a semiconductor substrate;

providing a polysilicon layer overlying said gate silicon oxide layer;

etching away said polysilicon layer where it is not covered by a mask to form a gate electrode on the surface of said semiconductor substrate wherein one side of said gate electrode is a source side and the other said of said gate electrode is a drain side;

oxidizing the surfaces of said gate electrode to form a surface oxide layer;

forming polysilicon spacers on the sidewalls of said gate electrode;

removing said polysilicon spacer on said source side of said gate electrode;

implanting first ions to form heavily doped source and drain regions within said semiconductor substrate not covered by said gate electrode and said polysilicon spacer on said drain side of said gate electrode;

removing said drain side polysilicon spacer;

implanting second ions to form a lightly doped drain region within said semiconductor substrate underlying said removed drain side polysilicon spacer;

depositing an insulating layer over the surface of said substrate;

etching an opening through said insulating layer to one of said source and drain regions; and depositing a conducting layer overlying said insulating layer and within said opening and patterning said conducting layer completing the fabrication of said integrated circuit device.

2. The method according to claim 1 wherein said gate silicon oxide layer has a thickness of between about 70 to 80 Angstroms.

3. The method according to claim 1 wherein said surface oxide layer has a thickness of about 100 Angstroms.

4. The method according to claim 1 wherein said polysilicon spacers have a width of about 1000 Angstroms.

5. A method of forming a lightly doped source and drain structure in the fabrication of an integrated circuit device comprising:

providing a polysilicon gate electrode overlying a layer of gate silicon oxide on the surface of a semiconductor substrate;

oxidizing the surfaces of said gate electrode to form a surface oxide layer;

forming polysilicon spacers on the sidewalls of said gate electrode wherein one side of said gate electrode is a source side and the opposite side of said gate electrode is a drain side;

removing said polysilicon spacer on said source side of said gate electrode;

implanting first ions to form heavily doped source and drain regions within said semiconductor substrate not covered by said gate electrode and said polysilicon spacer on said drain side of said gate electrode;

removing said drain side polysilicon spacer; and implanting second ions to form a lightly doped drain region within said semiconductor substrate underlying said removed drain side polysilicon spacer completing the formation of a lightly doped source and drain structure in the fabrication of an integrated circuit device.

6. The method according to claim 5 wherein said gate silicon oxide layer has a thickness of between about 70 to 80 Angstroms.

7. The method according to claim 5 wherein said surface oxide layer has a thickness of about 100 Angstroms.

8. The method according to claim 5 wherein said polysilicon spacers have a width of about 1000 Angstroms.

9. A method of forming a lightly doped source and drain structure having minimal source resistance in the fabrication of an integrated circuit device comprising:

providing a polysilicon gate electrode overlying a layer of gate silicon oxide on the surface of a semiconductor substrate;

oxidizing the surfaces of said gate electrode to form a surface oxide layer;

forming polysilicon spacers on the sidewalls of said gate electrode wherein one side of said gate electrode is a source side and the opposite side of said gate electrode is a drain side;

removing said polysilicon spacer on said source side of said gate electrode;

implanting first ions to form heavily doped source and drain regions within said semiconductor substrate not covered by said gate electrode and said polysilicon spacer on said drain side of said gate electrode;

removing said drain side polysilicon spacer; and implanting second ions to form a lightly doped drain region within said semiconductor substrate underlying said removed drain side polysilicon spacer wherein the presence of a wider heavily doped region on said source side instead of a lightly doped region as on said drain side results in the formation of said lightly doped source and drain structure having minimal source resistance in the fabrication of said integrated circuit device.

10. The method according to claim 9 wherein said polysilicon spacers have a width of about 1000 Angstroms.

* * * * *